United States Patent [19]

Lefebvre et al.

[11] Patent Number: 4,573,126

[45] Date of Patent: Feb. 25, 1986

[54] PROCESS AND DEVICE FOR MEASURING THE STATE OF CHARGE OF AN ELECTROCHEMICAL GENERATOR WHILE OPERATING

[75] Inventors: Jean-Paul Lefebvre, 10, Rue de Fief, 77930 Cely en Biere, France; Thierry Pedron, Meylan, France

[73] Assignees: Regie Nationale des Usines Renault, Boulogne-Billancourt; Jean-Paul Lefebvre, Cely en Biere, both of France

[21] Appl. No.: 476,312

[22] Filed: Mar. 17, 1983

[30] Foreign Application Priority Data

Mar. 17, 1982 [FR] France ................... 82 04493

[51] Int. Cl.$^4$ ................... G01R 13/02; G06F 15/56
[52] U.S. Cl. ................... 364/481; 324/426; 324/433
[58] Field of Search ................... 364/481, 483; 324/425–427, 429, 433

[56] References Cited

U.S. PATENT DOCUMENTS

| | | | |
|---|---|---|---|
| 3,898,548 | 8/1975 | Perelle et al. | 364/483 X |
| 4,017,724 | 4/1977 | Finger | 364/481 |
| 4,197,582 | 4/1980 | Johnston et al. | 364/483 |
| 4,217,645 | 8/1980 | Barry et al. | 364/483 |
| 4,290,109 | 9/1981 | Taniguchi et al. | 364/481 |
| 4,333,149 | 6/1982 | Taylor et al. | 364/481 |
| 4,377,787 | 3/1983 | Kikuoka et al. | 364/481 X |
| 4,445,090 | 4/1984 | Melocik et al. | 364/481 X |

*Primary Examiner*—Edward J. Wise
*Attorney, Agent, or Firm*—Oblon, Fisher, Spivak, McClelland & Maier

[57] ABSTRACT

Process and device for measuring the state of charge of an electrochemical generator such as a lead-acid battery, while operating. The device includes means for measuring the voltage of the generator means for storing the no-load voltage ($V=E(t_o)$) of the generator during its initial connection, then the last value of the computed electromotive force ($V$, $V_M$), means for computing the value of the difference $\Delta V$ between the measured voltage ($V_b$) of the generator and the last value of the computed electromotive force ($V$, $V_M$), means for determining the sign of said difference $\Delta V$, means for measuring the elapsed time ($\delta$) between two successive measurements of the voltage of the generator, means for computing the variation of electromotive force $\Delta E = f(\Delta V) \cdot \delta$ of the generator means for computing the value of the electromotive force from the last computed value and of said variation $\Delta E$, and means for displaying the computed value of the electromotive force.

15 Claims, 16 Drawing Figures

PROCESS AND DEVICE FOR MEASURING THE STATE OF CHARGE OF AN ELECTROCHEMICAL GENERATOR WHILE OPERATING

BACKGROUND OF THE INVENTION

1. Field of the Invention

This invention relates to a process and a device for measuring the state of charge of an electrochemical generator during charging or discharging of the generator. The invention applies mainly to lead generators, but it can also be applied to nickel generators or others.

2. Description of the Prior Art

Such devices as above noted are known which are based on several different principles:

ampere-hour meter devices which integrate the amperage of the generator and make it possible to count the ampere-hours delivered during an active and;

voltammetric devices, which by reference to a discharge curve use the voltage directly from the generator to describe the state of charge of the generator.

Voltammetric devices deduce the no-load electromotive force from the measurement of the voltage and of the current delivered by the generator through the a priori knowledge of the internal resistance of the generator and Ohm's Law.

These devices of the prior art exhibit numerous drawbacks such as:

poor knowledge of the initial capacity of the battery, misreading of the exact efficiency during the recharge, ignoring of the self-discharge;

a noncontinuous operation and ignoring low discharges;

presence of shunts to be calculated according to the applications and ignorance of the variation of the internal resistance of the generator while operating;

in the majority of the application made so far, the lack of operation during recharging of the generator.

Moreover, there is known, by French patent application FR No. 2,473,727, a process and an apparatus for determining the capacity of a battery according to which the no-load voltage $V_M$ of the battery during its initial connection, which represents its electromotive force E (to) at time to of the initial connection, is measured, then the charge or discharge voltage Vb of the battery at time $t_1$ is measured, the difference $\Delta V = E(to) - Vb$ is calculated, and the calculation is made of the value of the electromotive force $E(t_1)$ of the battery representing its state of charge at time $t_1$ as a function of the difference $\Delta V$ and its electromotive force at time to.

Unfortunately, this patent application exhibits a basic flaw which makes it unusable for a specialist of the art to the extent that it does not indicate how the electromotive force during charge or discharge, at time $t_2$, is calculated as a function of $\Delta V$ and of the electromotive force E (to) at the time of initial connection to.

It is known that the terminal voltage of a battery during charge or discharge depends at the same time on its state of charge and its speed or rate of charge or discharge. This is clear from the family of curves in FIG. 1A which illustrate the relation between voltage V of each cell of a lead storage battery expressed in volts and its period of discharge d expressed in hours. On this family, curve $C_1$ represents a state of charge of the battery equal to 50% of its capacity, curve $C_2$ a state of charge equal to 25% of its capacity and curve $C_3$ the final voltage of the cell for various times or discharge rates. Thus, for example, a voltage of 1.90 volts measured on a cell will correspond to a residual capacity of 50% with a discharge rate of two hours, and to residual capacity of about 25% with a discharge rate of 8 hours.

It is clear from the above that it is not possible, in the current state of knowledge about the functioning of electrochemical generators, to deduce the residual capacity of a battery during charge or discharge from the sole knowledge of its terminal voltage. Actually, it is further necessary to know its discharge rate. Now, this parameter is particularly difficult to measure since the batteries are generally subjected to a discontinuous operation, particularly in automobiles where the current delivered can vary in significant proportions over short periods.

SUMMARY OF THE INVENTION

Accordingly, one object of this invention is to provide a novel process and device which provide the determination of the state of charge of an electrochemical generator, whether it is charging or discharging, while being free of the measurement or computation of its discharge rate.

The above-noted object, as well as others, are achieved according to the invention by providing a novel process for measuring the state of charge of an electrochemical generator during charge or discharge of it, according to which the no-load voltage $V_M$ of the generator is measured during its initial connection, which represents its electromotive force E (to) at time to of the initial connection, then the charge or discharge voltage Vb of the generator at time $t_1$ is measured, the difference $\Delta V = E(to) - Vb$ is computed and the computation is made of the value of the electromotive force $E(t_1)$ of the generator representing its state of charge at time $t_1$ as a function of the difference $\Delta V$ and of its electromotive force E (to) at time to, characterized in that $E(t_1)$ is computed according to the relation $E(t_1) = E(to) - f(\Delta V) \cdot \tau$ in which $f(\Delta V)$ is a predetermined law which, for a given type of generator, is independent of the nominal capacity of the generator and depends on the number of cells which make it up and on the sign of the difference $\Delta V$ which is positive at discharge and negative at charge, and $\tau$ is the time elapsed between times to and $t_1$.

According to the invention, the above-noted predetermined law is in the form $(I/Io) = f(\Delta V)$, in which:

I is the current under which the generator is discharged or charged;

$Io = (Qo/3600)$;

Qo is the nominal charge of the battery defined for a given discharge period.

As an alternative, the predetermined law is in the form $(I/In) = f(\Delta V)$, in which:

I is the current under which the generator is discharged or charged;

$In = (Qn/3600)$

Qn is the available capacity of the battery at a determined charge or discharge rate.

According to another characteristic of the invention, voltage Vb of the generator during charge or discharge is measured periodically and after each measurement a computation is made of its electromotive force representing its state of charge according to the law $E(t+\tau) = E(t) - f(\Delta V)\tau$ in which $E(t+\tau)$ represents the electromotive force at a previously computed time t, $\tau$ represents the time elapsed between two successive measurements and $\Delta V = E(t) - Vb$ where Vb is the voltage measured at time $t + \tau$.

According to another characteristic of the invention, the temperature T of the electrolyte of the generator is measured and value $f(\Delta V)$ is determined as a function of the variable $\Delta V$ and of the parameter consisting of temperature T of the electrolyte.

The invention has also as its object a device for implementing the process defined above including means for measuring the voltage (Vb) of the generator, means for memorizing the no-load voltage $(V = E(to))$ of the generator during its initial connection, then the last value of the computed electromotive force $(V, V_M)$, means for computing the value of the difference $\Delta V$ between the measured voltage (Vb) of the generator and the last value of the computed electromotive force $(V, V_M)$, means for determining the sign of the difference $\Delta V$, means for measuring the time elapsed ($\tau$) between two successive measurements of the voltage of the generator, means for computing the variation of electromotive force $\Delta E = f(\Delta V) \cdot \tau$ of the generator, means for computing the value of the electromotive force from the last computed value $(V, V_M)$ and the variation $\Delta E$, and means for displaying the computed value of the electromotive force.

According to an embodiment of the device, the storage means includes an up-down counter, and the means for computing the variation of the electromotive force includes a computer to compare the difference $\Delta V$ with stored values $\Delta V_i$, a local oscillator which produces either one of two predetermined frequencies depending on the sign of the difference, a frequency generator which produces a frequency as a function of that of the local oscillator and of the value of the difference $\Delta V$, and means for selectively applying the output signal of the frequency generator to the up-down counter as a function of the sign of the difference $\Delta V$.

According to another embodiment of the device, it includes means for measuring the temperature T of the electrolyte of the generator, the variation of the electromotive force being computed by the computing means from the measured value of temperature T and from the value and from the sign of the difference $\Delta V$.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
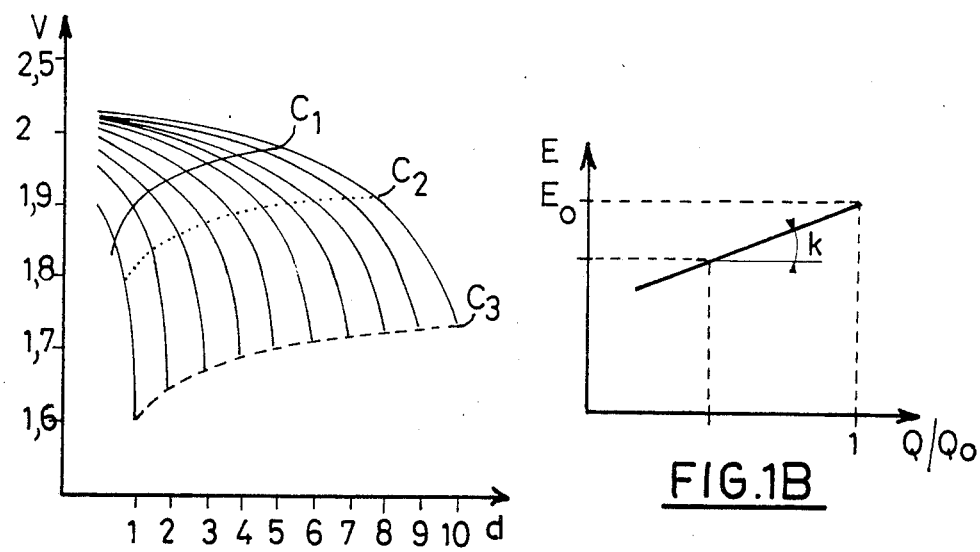
FIG. 1A is a family of curves illustrating, for a given temperature, the relation between the voltage of a lead storage battery cell (in volts) and the discharge rate of this cell (in hours)
Figure 1B:
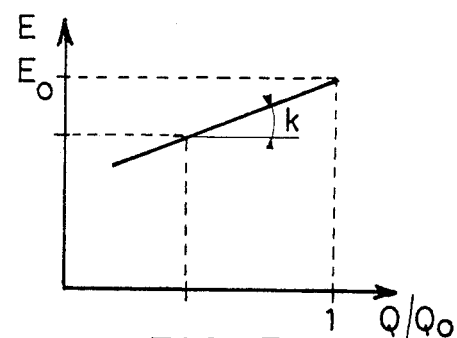
FIG. 1B is a graph illustrating the relation between the electromotive force E of a lead storage battery cell and its load Q.

Referring now to the drawings, wherein like reference numerals designate identical or corresponding parts throughout the several views, standard results show that the electrolyte density is a good indicator of the state of charge of electrochemical generators. On the other hand, an approximately linear law links this electrolyte density to the no-load electromotive force of the generator. Consequently, there is a law also nearly linear between the no-load electromotive force of the generator and its amount of charge, at least within a certain range of state of charge. This linear relation is illustrated in FIG. 1B where the electromotive force E is expressed as a function of the amount of charge Q reduced to the nominal charges Qo of the battery. The slope of this straight line being k, the relation between E and Q can be examined in the form:

$$E = Eo + k \cdot \left( \frac{Q}{Qo} - 1 \right) \tag{1}$$

in which:

Qo is the nominal charge of the battery defined for a given discharge period, for example 20 hours;

Eo is the electromotive force corresponding to the load Qo.

Moreover, by knowing that there is, at any time, $Q = Qo - \int I \, dt$, the expression (1) becomes:

$$E = Eo - k \int \frac{I}{Qo} \, dt \tag{2}$$

From these standard results it can be expressed: $Qo = Io \times 3600$. By replacing Qo in (2), there is obtained:

$$E = Eo - \frac{k}{3600} \int \frac{I}{Io} \cdot dt \tag{3}$$

The invention is based on the observation, original with respect to the prior knowledge in the matter of electrochemical generators, that there is a relation between the term (I/Io) and the difference $E - Vb = \Delta V$, E being the electromotive force of the generator and Vb its terminal voltage when it delivers or receives a certain current I. Therefore, there is $$(I/Io) = f(E - Vb) = f(\Delta V) \tag{4}$$

This relation is notable in the sense that for a given type of generator it depends only on the number of cells of the generator and on the temperature and is independent of the nominal charge of the generator.

Figure 1C:
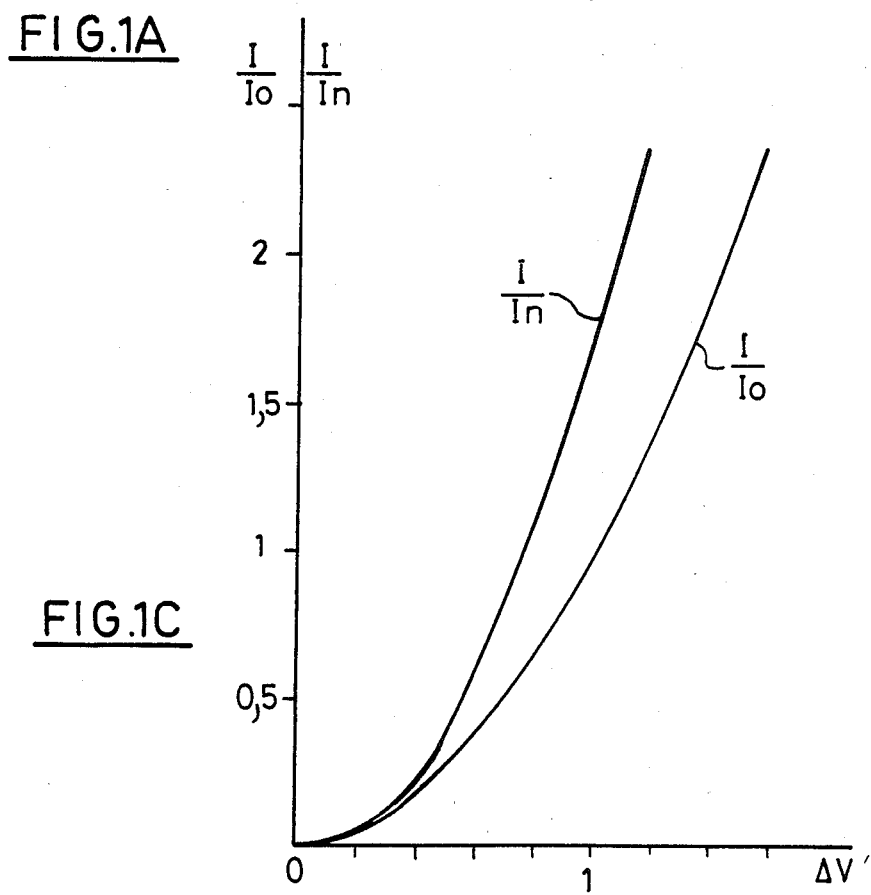
FIG. 1C is a graph showing the curves (I/Io) and (I/In) established as a function of $V = E - Vb$ for a 12 volt battery at a temperature of 20° C.

FIG. 1C illustrates this relation for a 12 V lead electrochemical generator operating at discharge under a temperature of 20° C. Similar curves (not shown) also link (I/Io) and $\Delta V = E - Vb$ in a certain operating range during charge.

From relations (3) and (4) and by considering the coefficient (k/3600) in the law f which links (I/Io) to $\Delta V$, it can be expressed, for slight variations of time $\tau$ as follows $$E(t+\tau)=E(t)-f(\Delta V)\cdot\tau \qquad (5),$$

a formula in which:

$\tau$ represents the sampling or scanning period of the voltage Vb of the battery during charge or discharge,
$E(t+\tau)$ represents the emf at time $t+\tau$;
$E(t)$ represents the emf at time t;
$\Delta V=E-Vb$, E being the emf of the generator and Vb its voltage when it delivers or receives a certain current I.

It is therefore possible, from the sole knowledge of the electromotive force of the generator at time to and of the voltage Vb at its terminals at time $to+\tau$, to deduce therefrom its electromotive force $E(to+\tau)$, and consequently its state of charge, at time $to+\tau$. By repeating the process, by scanning the voltage Vb of the generator with a periodicity $\tau$, the state of charge of the generator can therefore be known continuously, with an error that will be lower because $\tau$ will also be lower.

As has been indicated previously, the relation $(I/Io)=f(\Delta V)$ is a function of the temperature T of the electrolyte.

In FIG. 1C, the corresponding curve has been drawn for a temperature of 20° C., but it is obvious that a family of curves each corresponding to a given temperature can be established. By measuring the temperature T, it can thus be considered in the computation of $E(t+\tau)$.

Figure 2:
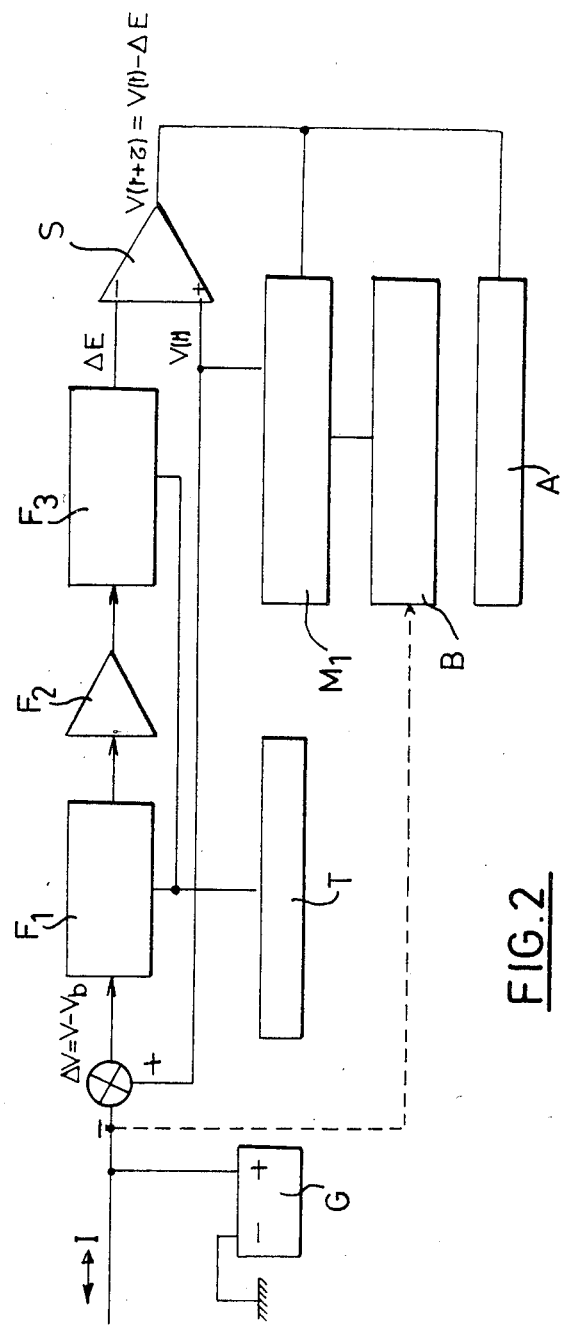
FIG. 2 is a block diagram illustrating the general structure of the device according to the invention.

With reference to FIG. 2, which is a block diagram of the device that makes it possible to use the above-described process, it is noted that the system is looped and that the contents V(t) of a memory $M_1$, in which is stored the value of the computed electromotive force, are substracted from the value of voltage Vb of generator G. The use of a certain transfer function $F_1$ representing the curve of FIG. 1C makes it possible to deduce the image of current I that the battery delivers; its integration at $F_2$ and the use of a second transfer function $F_3$ makes it possible to compute the drop of electromotive force $\Delta E$, subsequent to the current delivered during a certain time $\tau$, the time of a computing loop increased by a certain time lag; then the subtraction by circuit S of $\Delta E$ from the value of the computed electromotive force V(t) at time t makes it possible to deduce the new value of the electromotive force $V(t+\tau)$ at time $t+\tau$, a value which is substituted for V(t) in memory $M_1$ and displayed on a display device A.

The diagram is completed by a loop B for measuring the no-load voltage of the generator at the initial moment of its commencing charge or discharge operation, and possibly by a block T for measuring the temperature which can be considered at the site of transfer functions $F_1$ and $F_2$.

Figure 3:
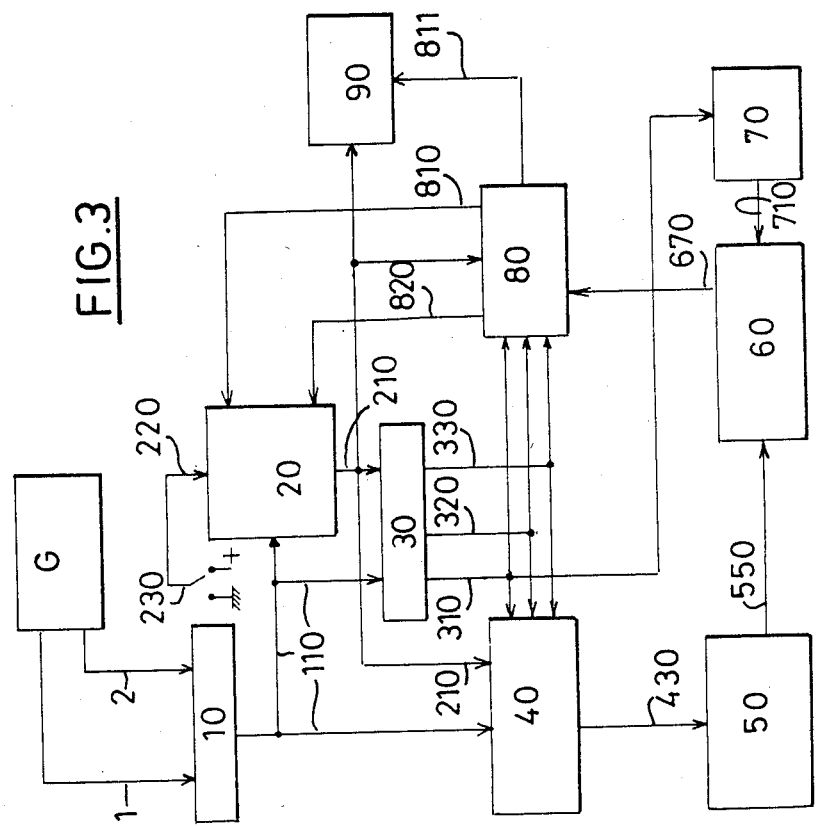
FIG. 3 is a general electrical diagram illustrating an embodiment of the measuring device according to the invention in which the temperature of the electrolyte is not considered.

With reference to FIG. 3, the voltage Vb information of the generator G is applied to an analog-to-digital converter system 10 by conductors 1 and 2.

This converter samples the voltage of the generator G at a frequency of 41 kHz. The output of converter 10 is connected to a synchronous binary up-down counter 20 and to a system 40 for computing the absolute value of the battery voltage-electromotive force difference computed by an 8-bit data bus 110.

A bus 210 at the output of synchronous up-down counter 20 couples the value of the computed electromotive force $V=E(t)$ to a comparator 30. The data contained in this bus is compared with that of bus 110, which transmits the battery voltage information digitally. Three binary data describing the relative value of the two input data 110 and 210 leave this comparator 30 on conductors 310, 320 and 330.

These data 310, 320 and 330 are used by computer 40, which also receives the battery voltage data Vb (bus 110) and value of the computed electromotive force V (bus 210), computes the absolute value of the battery voltage difference minus electromotive force, $\Delta V$. The difference is compared with a group of values $\Delta Vi$ stored in the comparators of a computer 50 having an output bus 550 that controls analog switches contained in a block 60. This block 60 produces on conductor 670 a signal having a frequency which is a function of $\Delta V$ applied by bus 550 and a frequency generated by a local oscillator 70. This oscillator is itself controlled by the data 310 coming from comparator 30. Thus, the base frequency fo coming from oscillator 70 is controlled by the behavior of the battery: charge or discharge.

Conductor 670 is connected to a system 80 which selects the value of its outputs 810 and 820 as a function of the data coming from comparator 30 via conductors 310, 320 and 330. Outputs 810 and 820 are connected to the up and down inputs of synchronous up-down counter 20.

A conductor 811 connected to a system 90 for displaying the information received by bus 210, i.e., the computed electromotive force V, is also connected to an output of system 80.

The operation of the device of FIG. 3 will now be described with reference also to FIGS. 4 to 12.

Figure 4:
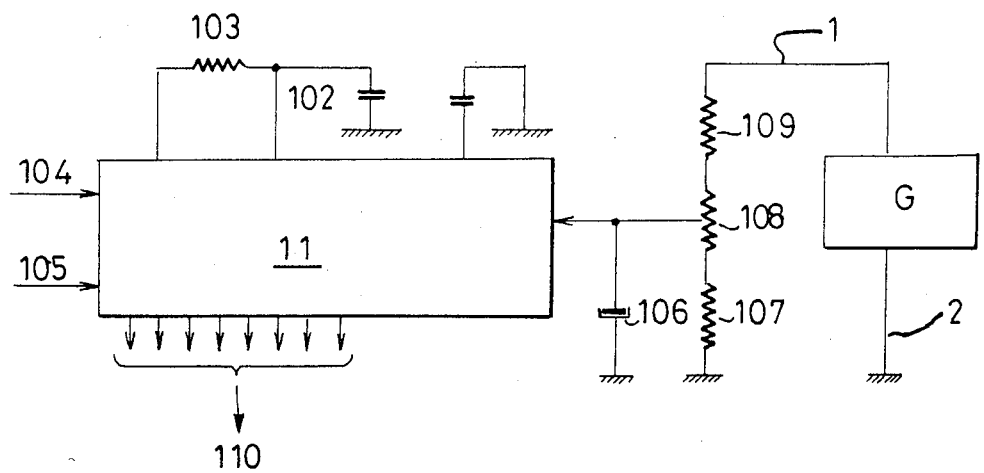

During operation, the electric signal coming from generator G by way of conductor 1 is applied to a divider bridge 107, 108 and 109, dividing the voltage by a number as a function of the number of cells (FIG. 4). Then, this signal enters the input of an analog-digital converter 11, after having been filtered by a capacitor 106. This analog-digital converter 11 has an internal clock whose frequency is determined by a resistor 103 (10 k$\Omega$) and a capacitor 102 (2.2 nF). The ends of resistor 103 are connected to the inputs CLK R and CLK IN of the converter. The frequency of the converter is thus fixed at 41 kHz. The converter is fed by conductors 104 and 105 of 5 V. A data bus 110 connected to converter 11 carries the generator voltage information, marked Vb, in the rest of the device.

Figure 5:
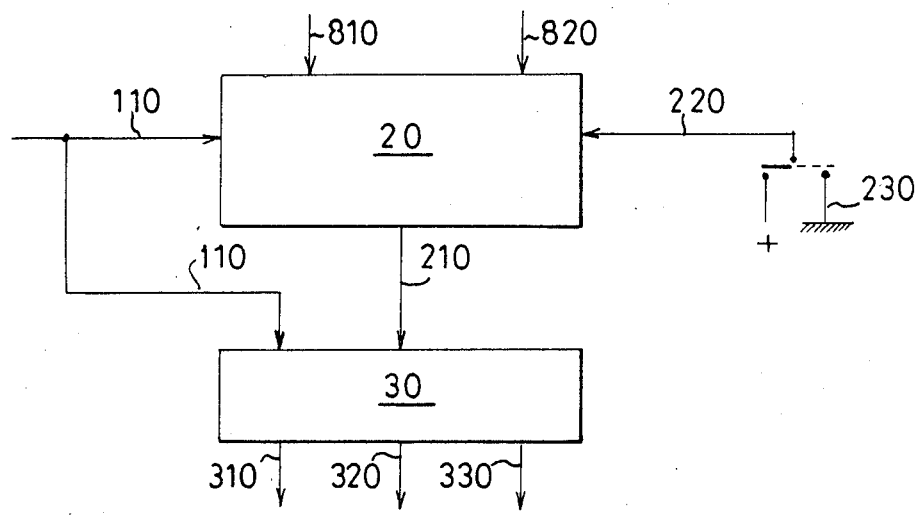

FIG. 5 shows that up-down counter 20 has the role of processing the data coming from bus 110. At an initial time, the converter system collects the no-load generator voltage information and transmits this information to up-down counter 20. At this initial time; an inverter 230 is set at "0": a conductor 220 therefore also sets the "LOAD" input of counter 20 to "0", which makes it possible to store the initial electromotive force of the generator. Inverter 230 is then set at state "1". During operation, the terminal voltage of generator G varies when the generator is acted on by a current I passing through it (charge or discharge). The system formed by elements 30, 40, 50, 60 and 80 computes the rate of increase or decrease of the electromotive force initially stored in up-down counter 20. The result of this computation is transmitted to the down and up inputs of up-down counter 20 by conductors 810 and 820, respectively. Bus 210 representing the electromotive force of the generator, marked V; at the time under consideration, comes out of up-down counter 20. Buses 110 and 210 are applied to 8-bit comparator 30, formed from two MC74C193 4-bit comparators placed in cascade. Comparator 30 has three outputs connected to three conductors 310, 320 and 330:

If Vb<V, outputs 310, 320 and 330 are in the state "1", "0", "0", respectively.

If Vb>V, outputs 310, 320 and 330 are in the state "0", "1", "0".

If Vb=V, outputs 310, 320 and 330 are in the state "0", "0", "1".

Figure 6:
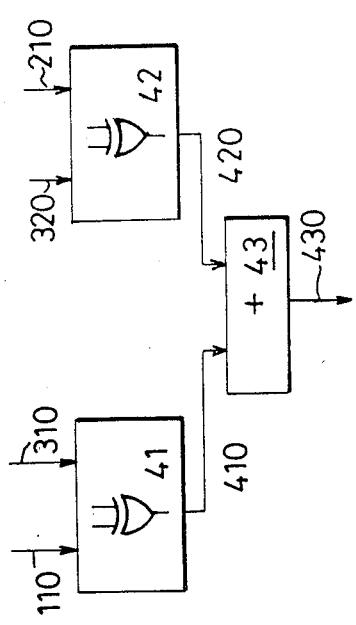
FIGS. 4 to 12 are detail diagrams of some of the circuits of the device of FIG. 3.

FIG. 6 is a study of system 40 described in the electrical diagram of FIG. 3. This system computes the absolute value of the difference V−Vb by proceeding in the following manner:

If Vb<V, conductor 310 is in state "1" and conductor 320 in state "0".

A signal $\overline{Vb}$, complementary of Vb, is generated by block 41, which is a group of eight "Exclusive-OR" gates of the type CD 4 030. This signal is carried by a bus 410.

Signal V, carried by a bus 420, is generated by block 42, which is also a group of eight "Exclusive-OR" gates of the CD 4 030 type.

These buses 410 and 420 are applied to a summing integrator 43 which puts out the value $V+\overline{Vb}$ or else V−Vb. This summing integrator 43 is made using two CD 4008 averagers in cascade.

If Vb>V, conductor 310 is in state "0" and conductor 320 in state "1". For the rest, the process is identical with the one described above. Summing integrator 43 generates value $Vb+\overline{V}$ or Vb−V.

Consequently output bus 430 of summing integrator 43 indeed carries the information $\Delta V = |V-Vb|$.

Figure 7:
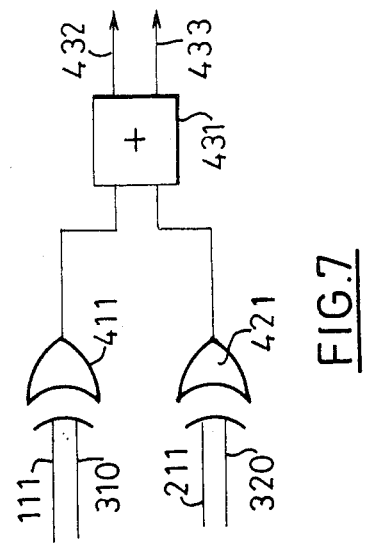

FIG. 7 describes the computation at the site of a bit. Conductors 111 and 211 carry bits of the same weight of Vb and V. The output of two "Exclusive-OR" gates 411, 421 are applied to a summing integrator by bit 431 which gives the value of the bit, sum of the same weight 432, and the borrow in 433.

Figure 8:
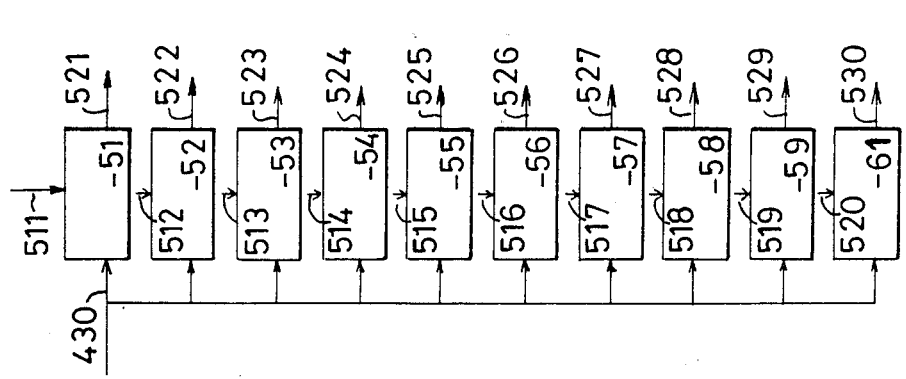

Bus 430 is applied to ten comparators 51 to 59 and 61 (2 times ten MMC 7 485), as shown in FIG. 8. The data contained in bus 430 is compared to 10 values (data buses 511 to 520) representing the data ΔVi of the curve selected in FIG. 1C. This data ΔVi is in a progression defined by the shape of this curve. From these comparators the information "1" is generated on conductors 521 to 530 if:

$\Delta V = |V-Vb| > \Delta Vi$, and "0" if $\Delta V < \Delta Vi$.

Figure 9:
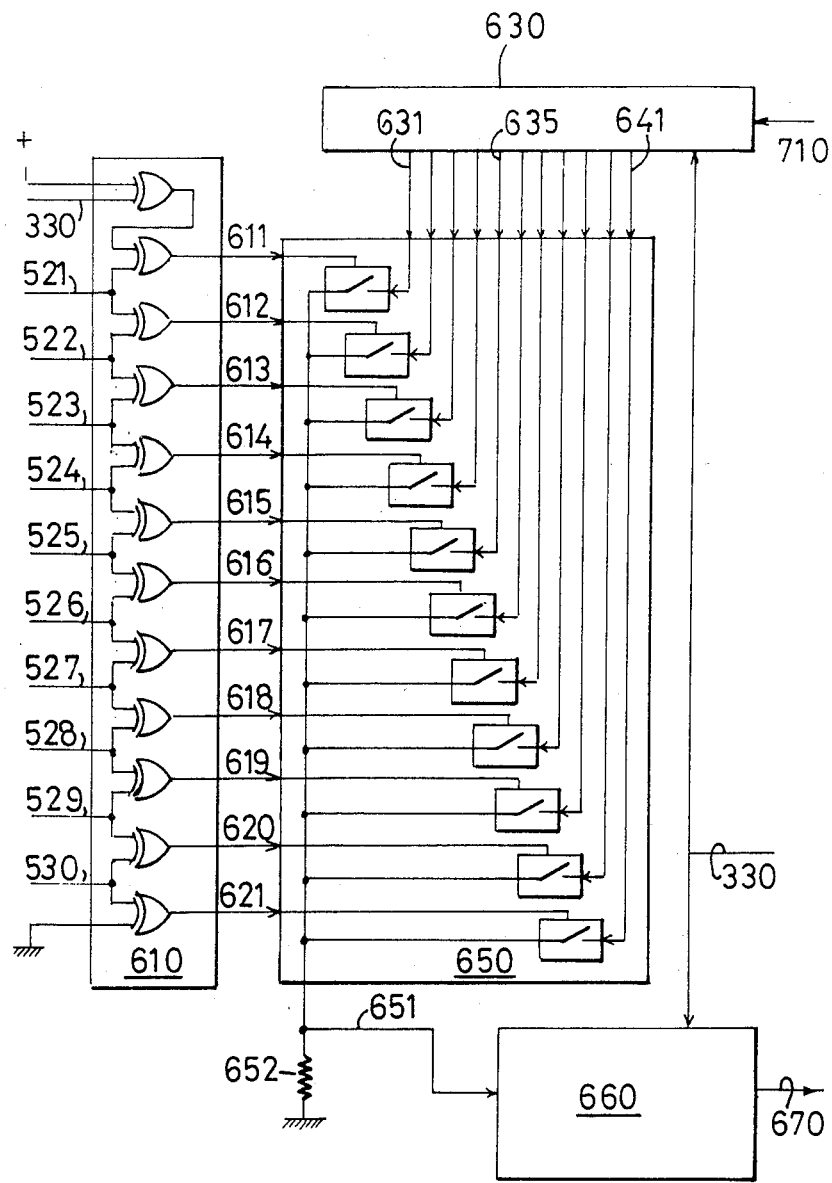

FIG. 9 shows the use of the ten conductors 521 to 530 which are applied two by two on ten "Exclusive-OR" gates of a block 610, so that outputs 611 to 621 of this block 610 are all at "zero" except one of them which is in state "1": this conductor will be such that on one of the inputs of the "Exclusive-OR" gates in question will appear the "0" level and on the other input the "1" level. If $\Delta V_{i-1} < \Delta V < \Delta V_i$, then conductor 611 will be in state "1" and it will be the only one of this series. These conductors 611 to 621, when they are in state "1", activate analog switches contained in a block 650. Each input of these switches is connected to one of the outputs $Q^k$ 631 to 641, with k an integer between 2 and 12, of a binary 12-stage counter 630, implemented by means of a CD 4 040. It divides by $2^k$, k being an integer between 2 and 12, the signal coming from the local oscillator defined in FIG. 10.

Therefore, a single signal whose frequency fk is equivalent to $fo/2^k$ comes from block 650, fo being the frequency of the local oscillator and k depending on the analog switch selected by gates 610. This signal is carried by a conductor 651, 652 being a load resistor for the switches of block 650. Conductor 651 is applied to the "clock" input of a second binary counter 660, CD 4 020. Signal 670 whose frequency is $2^{14}$ times smaller than that of the input signal is generated by the counter 660. The frequency of this signal therefore, is equivalent to $fo \times 2^{-14-k}$. The "RESET" inputs of the two counters 630 and 660 are connected to the output A=B of the comparator 30 by conductor 330. When V=Vb, this output is in state "1" and the signal which output from counter 660 on conductor 670 is in state "0". The following will show that this state blocks the counting of the up-down counter 20.

Figure 10:
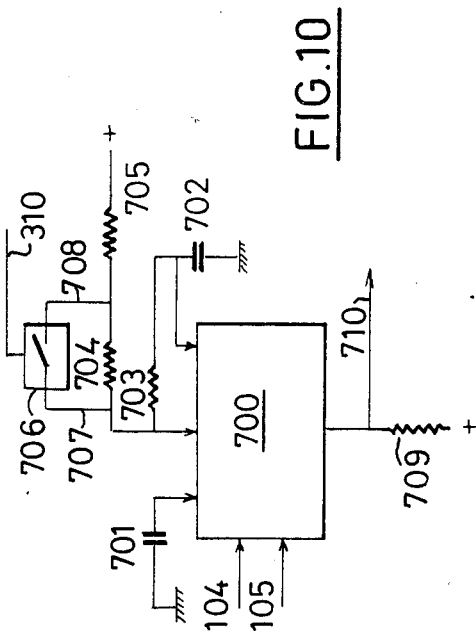

FIG. 10 explains the operation of the local oscillator used by counter 630. It is a circuit 700 of the type ICM 7555 mounted in an astable multivibrator. Signals 104 and 105 are power supply voltages. The frequency of the oscillator is fixed by resistors 703(1k Ω), 704(47k Ω) and 705(15k Ω), and by a capacitor 702(33 nF). If generator G is discharging, then Vb<V and conductor 310 carries a signal "1". This conductor enters an analog gate control. In this state, the outputs 707 and 708 of this switch are therefore connected and the oscillation frequency $fo_d$ is equivalent to 2.6 kHz. If generator G is charging, then conductor 310 is at zero, analog switch 706 is in a non-conductive state and the oscillation frequency $fo_c$ is equivalent to 691 Hz. Output 710 of circuit 700 is connected to the plus of the power supply by a load resistor 709 of 10k Ω. This output is applied to binary counter 630, as has already been described in the preceding paragraph.

Figure 11:
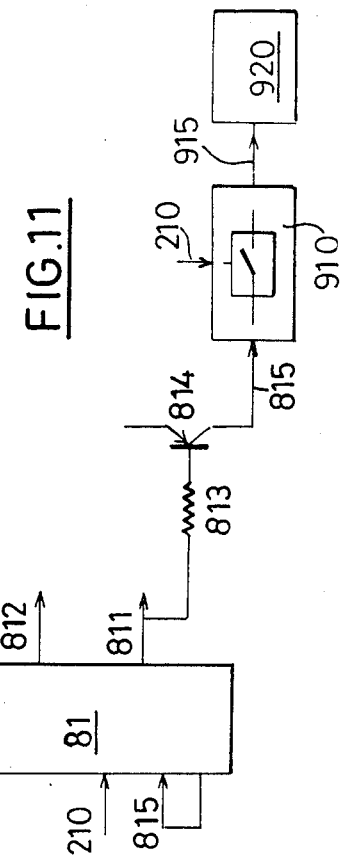

With reference to FIG. 11, system 80 includes a circuit 81 formed of two MM 74 C 85 comparators. Conductor 815 is a bus of a word of 8 bits stored in circuit 81 and which defines two high and low stops. Associated with the computed emf data V (conductor 210), circuit 81 makes it possible to apply to conductors 811 and 812 two data which define two stops for this computed electromotive force V. Let $E_B$ be the low stop and $E_H$ the high stop, the circuit 81 performs the following function:

| | |
|---|---|
| If $V < E_B$ | 811 is at "1" and 812 at "0" |
| If $E_B < V < E_H$ | 811 is at "0" and 812 at "0" |
| If $V = E_H$ | 811 is at "0" and 812 at "1" |

The data of conductors 811 and 210 are processed by a device for creating the display, including a resistor 813, a transistor 814 and analog gates 910.

If $V < E_B$, transistor 814 is blocked and display device 920 is in a low state;

If $V > E_B$, transistor 814 is conducting and the information of output bus 915 of the group of programmable analog switches 910, of the type CD 4 066, is modulated by the value of the electromotive force V transmitted by conductor 210.

Display device 920 can be made by light-emitting diodes or by a milliammeter.

Figure 12:
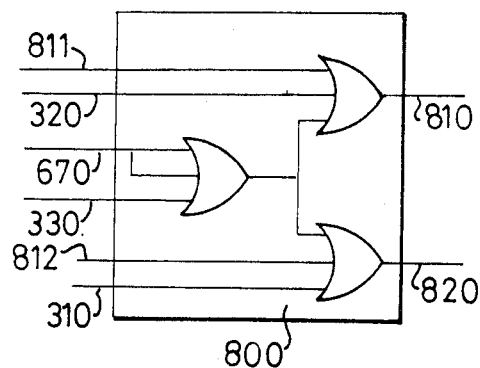

The rest of system 80 is shown in FIG. 12 as including a gate circuit 800 which performs the following logic functions 800.

In the case of discharge; Vb<V. Then,

If V<$E_B$; 811 is in state "1", 320 in state "0", 330 in state "0", 812 in state "0", 310 in state "1", consequently, "down" output 810 is in state "1", as well as "up" output 820, counter 20 is blocked;

if $E_B$<V<$E_H$; 811 is in state "0", 320 in state "0", 330 in state "0", 812 in state "0", 310 in state "1"; consequently "down" output (conductor 810) reproduces the "clock" input signal carried by conductor 670, and "up" output (conductor 820) is in state "1"; counter 20 counts down;

if V=$E_H$; 811 is in state "0", 320 in state "0", 330 in state "0", 812 in state "1", 310 in state "1"; output 810 reproduces input signal 670, while output 820 is in state "1"; counter 20 counts down.

In the case of charging; Vb>V. Then, if V<$E_B$; 811 is at "1", 320 at "1", 330 in state "0", 812 in state "0", 310 in state "0"; consequently output 820 reproduces the input signal carried by 670, while 810 is in state "1"; counter 20 counts up;

if $E_B$>V>$E_H$; 811 is in state "0", 320 in state "1", 330 in state "0", 812 in state "0", as well as 310, hence 810 is in state "1", 820 reproduces the state of the signal carried by 670; counter 20 counts up;

if V=$E_H$; 811 is in state "0", 320 in state "1", 330 in state "0", 812 in state "1", 310 in state "0"; hence, 810 and 820 in state "1"; counter 20 is blocked.

In the case of non-use of the generator, Vb=V. Under these conditions, 330 is in state "1" and outputs 810 and 820 are both in state "1", counter 20 is blocked and keeps output 210 in its state V.

Figure 13:
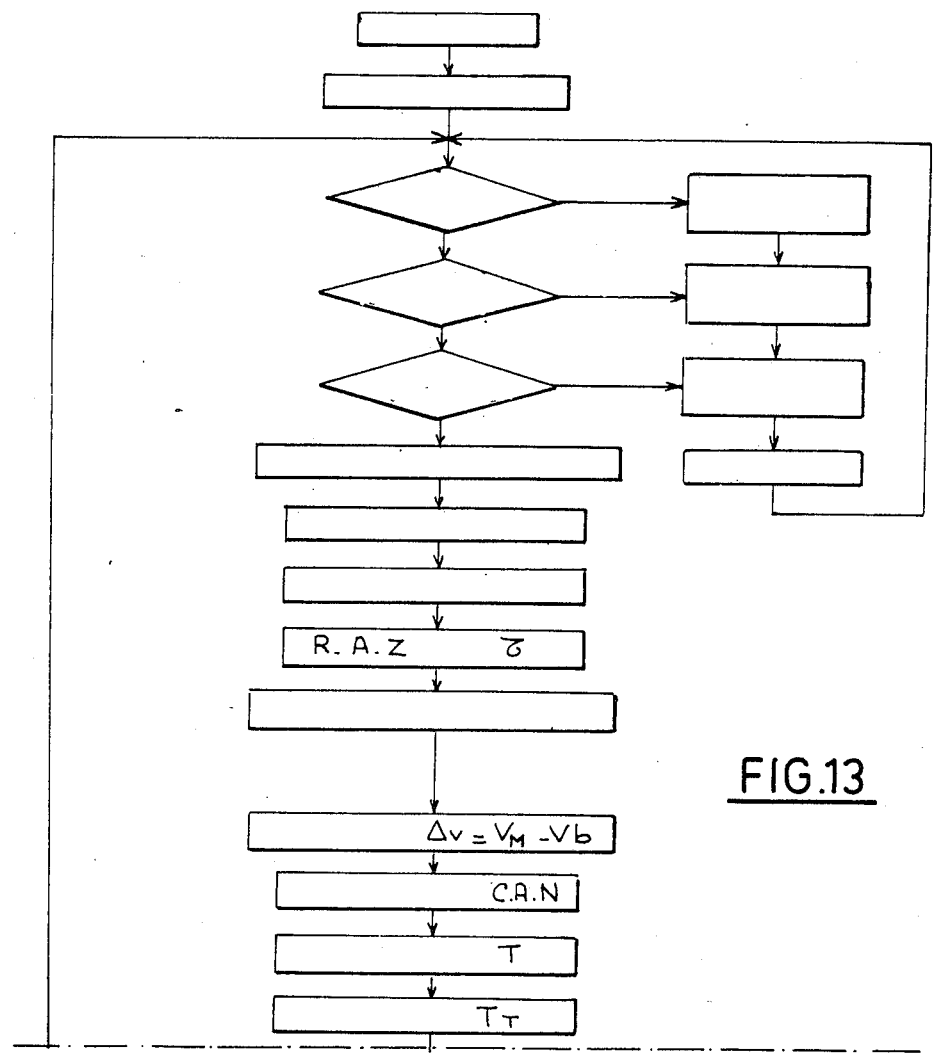
FIGS. 13 and 14 are flow charts which together illustrate the operation of the process according to the invention in the case where it is used with a microprogrammed computer, according to a second embodiment of the device according to the invention.
Figure 14:
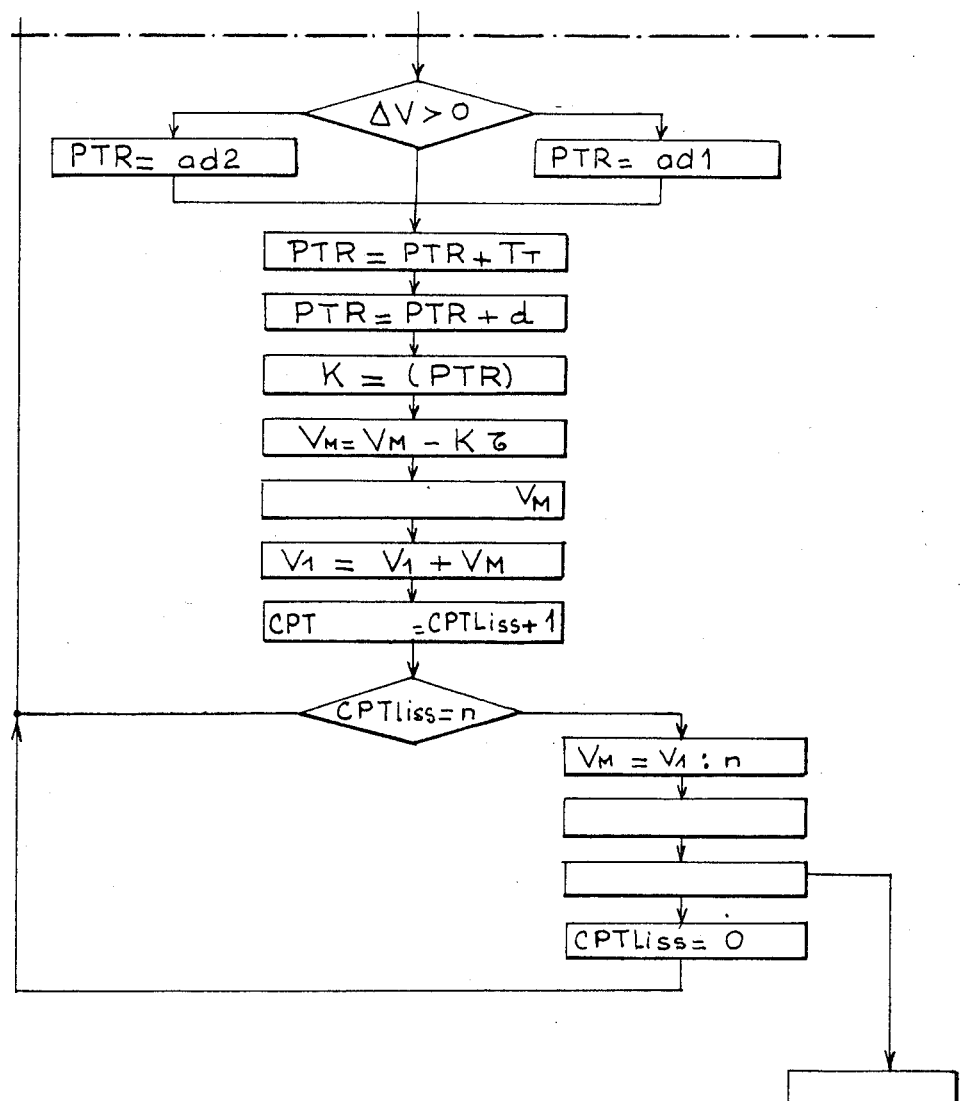

FIGS. 13 and 14 explain the process for computing the electromotive force according to the invention in the case where the computer used is of the microprogrammed type.

The operation begins as soon as it is switched on. An initializing sequence is performed at first. In this sequence, there is first of all initiation of the analog-digital converter for measuring the voltage of generator G, then storing the value of the no-load voltage in a memory $M_1$; the contents of $M_1$ are marked $V_M$;

the time counter is initialized at zero, then the counting is begun; and an index defining the number of loops during which the computation is performed before the output of a result is set at zero; this index is marked "CPT smooth"; and a memory M7 is set at zero.

A checking phase follows, including:

checking of the connection of the generator, using $V_M$;

checking of the presence of the temperature pickup; this check is performed by the converter then by comparison of the results with two stops, high and low; and checking of the display by tests on the value of the output current.

According to the results of this check, there is a display of an error code, then looping back on the check after time lag.

Initiation of the operations follows until the computation phase:

initiation of the analog-digital conversion, reading of the value Vb, then storing in a memory $M_2$;

reading of the elasped time from the starting of the device; this value $\tau$ is placed in memory $M_3$;

resetting of the time counter to zero, and new initiation of this time counter.

The computation begins at the following phase:

computation of the difference $\Delta V = V_M - Vb$; storage of $\Delta V$ in a memory $M_4$;

initiation of the analog-to-digital converter; and reading of the value of temperature T on the second path; storage of this value in a memory $M_5$.

There follows a computation of "T slice" which is an addressing step, which will make it possible for the pointer to collect the good data located in a ROM memory. $T_T$ is stored in a memory $M_6$.

The following phase is a test on the sign of $\Delta V$:

the result of this test is the positioning of the pointer on a certain address defining the family of curves connected to the charge or discharge of the generator;

the following is an increment of the pointer of the "T slice" value, $T_T$, defined above.

Thus, the pointer is positioned on a single curve.

Then, the pointer is incremented by a value d which is a function of V, computed above.

The value d can be obtained:

either by positioning of an index after comparison with $\Delta V$ with values $\Delta E_i$ placed in memory;

or by direct computation when the laws which define $\Delta V$ are put in "analytical" forms;

or by comparison and computation if the curves are defined in the form of families of straight lines.

Once the pointer is positioned on the good address, there is reading of the contents of the memory. These contents are K.

The following computation makes it possible to obtain the new value of the electromotive force of the generator by the following law:

$$V_M(t+\tau) = V_M(t) - K\tau,$$

$V_M(t)$ being the contents of memory $M_1$.

This new value is added to the contents of memory $M_7$, the sum of the values previously computed, $V_1$. The index, called "CPT smooth", is then incremented by the value 1.

A test phase follows on this index, as follows:

if it is less than a value n, there is looping back on the check, then initiation of a new loop of computations;

if it is equal to a certain value n, an averaging computation follows: the contents of $M_7$, $V_1$, are divided by n; the result $V_M$ is stored in $M_1$, then displayed; the smoothing index "CPT smooth" is set at zero; and then the system loops back to the checks.

Of course, the invention is not limited to the two embodiments described above. Thus, for example, an analog version can be designed. One of the versions would consist in the simulation of the curve of FIG. 2 by a network formed of a diode and a resistor. The embodiment of the microprogrammed version is not limited in itself. Either a group of points for defining the curves used, or a digital equation can be entered into a read-only memory. This microprogrammed version can have a single microprocessor having its own analog-to-digital conversion, or a microprocessor connected to a group of external components such as analog-to-digital converters. This microprogrammed version can also be the object of an embodiment by specific microcomputer.

Moreover, in the example described so far, the device provides an indication of the charge potentially available in the battery at a given time, i.e., the fraction of the nominal charge Qo stored in the battery. However, this fraction will generally not be totally available at the time under consideration taking into account the fact that the actual capacity of a battery depends on its discharge rate. Thus, for example, a battery capable of supplying 250 ampere-hours in 5 hours could furnish only 210 ampere-hours in 2 hours and 180 ampere-hours in 1 hour. Now, the measurements show that this battery will have a nominal charge Qo equivalent to 330 ampere hours for a discharge period of 20 hours. With the discharge rates of 5 hours, 2 hours and 1 hour, respectively, the device will indicate, at the end of the period under consideration, a residual capacity equal to 24%, 36% and 45% of Qo, respectively. Actually, the battery can then no longer supply energy at the discharge rate under consideration and this residual capacity will be available only after a certain rest period, on the order of several hours, of the battery.

It is understood that the indication of residual capacity supplied by the device is advantageous for a user having to use the battery after a certain idle period. This is the case, for example, of automobile batteries.

The same holds true for other applications, particularly electrical industrial trucks, where a user needs to know at all times the capacity still available so as to link up with a recharging station at the proper time. Under these conditions, it is desirable to adapt the indication of the device to the present discharge rate. To do this, the same law for computing the state of charge of battery is still used, namely:

$$E(t+\tau) = E(t) - f(\Delta V) \cdot \tau,$$

but with a function $f(\Delta V)$ adapted to the discharge rate and defined by: $f(\Delta V) = (I/In)$ (6), a relation in which:

$$In = (Qn/3600)$$

Qn is the available capacity of the battery at a determined charge or discharge rate.

Like the relation (4), the relation (6) depends, for a given type of electrochemical generator, only on the number of cells of the generator and on the temperature, and is independent of the nominal charge of the generator. It can be easily established experimentally and an example of it is given in FIG. 1C which shows the curve $(I/In) = f(\Delta V)$ for a 12-volt lead battery at a temperature of 20° C.

It will be noted that the varlue $E(t+\tau)$ computed from the relation $f(\Delta V) = (I/In)$ no longer represents the actual capacity, but the capacity of the battery available at any time. Thus, the examples of a battery of 250 Ah in 5 hours, 210 Ah in 2 hours and 180 Ah in 1 hour, the device will display a capacity of 0% at the end of 5 hours, 2 hours and 1 hour, respectively.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for measuring the state of charge of an electrochemical generator formed of at least one cell during charging or discharging of the generator, comprising:
    measuring a no-load voltage $V_M$ of the generator during an initial connection thereto, said no-load voltage $V_M$ corresponding to an electromotive force E(to) at time to of said initial connection;
    selectively charging or discharging said generator;
    measuring the voltage Vb during selective charging or discharging of the generator at a time $t_1$, and computing a difference $\Delta V = E(to) - Vb$;
    computing a value of the electromotive force $E(t_1)$ of the generator representing its state of charge at time $t_1$ as a function of the difference $\Delta V$ and its electromotive force E(to) at time to, wherein $E(t_1)$ is computed according to the relation $$E(t_1) = E(to) - f(\Delta V) \cdot \tau,$$

in which $f(\Delta V)$ is a predetermined law which, for a given type of generator, is independent of the nominal capacity of the generator and depends on the number of cells which make up the generator and on the sign of the difference $\Delta V$ which is positive at discharge and negative at charge, and $\tau$ is the elapsed time between times to and $t_1$.

2. A process as in claim 1, wherein said predetermined law is in the form $(I/Io) = f(\Delta V)$, in which,
    I is the current under which the generator is discharged or charged,
    Io = (Qo/3600), and
    Qo is a nominal charge of the battery defined for a given discharge period.

3. A process as in claim 1, wherein said predetermined law is in the form:
    $(I/In) = f(\Delta V)$, in which,
    I is the current under which the generator is discharged or charged,
    In = (Qn/3600), and
    Qn is an available capacity of the battery at a determined charge or discharge rate.

4. A process as in claim 1, comprising:
    measuring the voltage Vb of the generator during charge or discharge periodically; and
    computing after each measurement the electromotive force representing the state of charge of the generator according to the law, $E(t+\tau) = E(t) - f(\Delta V) \cdot \tau$, in which $E(t+\tau)$ represents the electromotive force at time $(t+\tau)$, E(t) represents the electromotive force at a previously computed time t, $\tau$ represents the elapsed time between two successive measurements, and $\Delta V = E(t) - Vb$, where Vb is the voltage measured at time $(t+\tau)$.

5. A process as in claim 1, comprising:
    measuring temperature T of the electrolyte of the generator; and
    computing the value of $f(\Delta V)$ as a function of the variable $\Delta V$ and as a function of the temperature T of the electrolyte.

6. A device for measuring the state of charge of an electrochemical generator during charging or discharging of the generator, comprising:
    means for measuring and storing the voltage (Vb) of the generator;
    means for measuring and storing the no-load voltage ($V_M = E(to)$) of the generator during its initial connection;
    means for computing and storing electromotive force (V, $V_M$) of the generator;
    means for computing the value of the difference $\Delta V$ between the measured voltage (Vb) of the generator and the last value of the computed electromotive force (V, $V_M$);
    means for determining the sign of said difference $\Delta V$;

means for measuring the elapsed time ($\tau$) between two successive measurements of the voltages of the generator;

means for computing the variation of the electromotive force $\Delta E = f(\Delta V)\cdot\tau$ of the generator, where $f(\Delta V)$ is a predetermined law based on $\Delta V$;

means for computing the value of the electromotive force from the last computed value (V, $V_M$) and of said variation $\Delta E$; and means for displaying said computed value of the electromotive force.

7. A device as in claim 6, comprising:

said storage means comprising an up-down counter; and said means for computing the variation of the electromotive force comprising, a computer for comparing said difference $\Delta V$ with stored values $\Delta V_i$, a local oscillator which produces one of two predetermined frequencies depending on the sign of said difference, a frequency generator which produces a frequency as a function of the frequency of the local oscillator and of the value of said difference $\Delta V$, and means for applying selectively to the up-down counter an output signal of the frequency generator as a function of the sign of the difference $\Delta V$.

8. A device as in claim 7, wherein the means for computing the difference $\Delta V$ comprises:

a first group of gates each connected respectively to the means for measuring the voltage Vb and to the means for determining the sign of the difference $\Delta V$, a second group of gates each connected respectively to up-down counter and to the means for determining the sign of the difference $\Delta V$, and a summing integrator connected to outputs of the first and second groups of gates.

9. A device as in claim 8, wherein the computer for comparing the difference $\Delta V$ with stored values $\Delta V_i$ comprises a group of comparators which each receive at their input the value of $\Delta V$ produced at the output of the summing integrator and one of said stored values $\Delta V_i$.

10. A device as in claim 9, wherein the frequency generator comprises:

a group of Exclusive-OR gates connected to the outputs of said comparators, and a group of n analog switches controlled by said Exclusive-OR gates and connected to the respective signals $Q_k$ of a counter which receives the signal from the local oscillator of frequency (fo) and divides it by $2^k$, k being an integer between 2 and n+1, said group of n analog switches producing at an output a frequency signal $fo/2^k$, wherein the value of k depends on the analog switch selected by said group of gates.

11. A device as in claim 10, wherein the means for applying selectively to the up-down counter the output signal of the frequency generator comprise a combining logic circuit having inputs which receive said signal of the frequency generator, the signals representing the sign of the difference $\Delta V$, and two signals defining high and low stops that make it possible to block the up-down counter in case said stops are exceeded by the computed electromotive force.

12. A device as in claim 6, further comprising:

means for measuring the temperature T of the electrolyte of the generator, the variation of the electromotive force being computed by said computing means for the measured value of the temperature T and of the value and of the sign of said difference $\Delta V$.

13. A device as in claim 12, comprising:

means for summing the n values of the electromotive force consecutively computed; and means for computing and displaying the average of said n values.

14. A device as in claim 6, comprising:

means for summing the n values of the electromotive force consecutively computed; and means for computing and displaying the average of said n values.

15. A device as in claim 6, wherein said computing means comprise a microprogrammed computer.

* * * * *